US012805373B2

(12) United States Patent
Bin et al.

(10) Patent No.: US 12,805,373 B2
(45) Date of Patent: Nov. 17, 2026

(54) POWER MODULE

(71) Applicant: AMOSENSE CO., LTD., Cheonan-si (KR)

(72) Inventors: Jinhyuck Bin, Cheonan-si (KR); Hyeonchoon Cho, Cheonan-si (KR); Taeho Cho, Cheonan-si (KR); Intae Yeo, Cheonan-si (KR); Ikseong Park, Cheonan-si (KR); Seunggon Park, Cheonan-si (KR)

(73) Assignee: AMOSENSE CO., LTD., Cheonan-si (KR)

(*) Notice: Subject to any disclaimer, the term of this patent is extended or adjusted under 35 U.S.C. 154(b) by 365 days.

(21) Appl. No.: 18/573,297

(22) PCT Filed: Jun. 24, 2022

(86) PCT No.: PCT/KR2022/008991
§ 371 (c)(1),
(2) Date: Dec. 21, 2023

(87) PCT Pub. No.: WO2022/270960
PCT Pub. Date: Dec. 29, 2022

(65) Prior Publication Data

US 2024/0321692 A1 Sep. 26, 2024

(30) Foreign Application Priority Data

Jun. 25, 2021 (KR) ........................ 10-2021-0083038

(51) Int. Cl.
*H10W 72/50* (2026.01)
*H10W 40/25* (2026.01)
(Continued)

(52) U.S. Cl.
CPC ......... *H10W 72/50* (2026.01); *H10W 40/255* (2026.01); *H10W 90/00* (2026.01);
(Continued)

(58) Field of Classification Search
CPC ... H10W 72/50; H10W 40/255; H10W 90/00; H10W 72/884; H10W 90/734;
(Continued)

(56) References Cited

U.S. PATENT DOCUMENTS 6,486,548 B1 11/2002 Nakatsu et al.
2007/0160858 A1* 7/2007 Fukuda .................... H05K 3/38
257/E23.188
(Continued)

FOREIGN PATENT DOCUMENTS

EP 1035586 A1 9/2000
EP 3139407 A1 3/2017
(Continued)

OTHER PUBLICATIONS

EP European Extended Search Report dated Aug. 26, 2024 in application 22828807.2.

*Primary Examiner* — Jacob Y Choi
*Assistant Examiner* — Ashley Nicole Blackwell
(74) *Attorney, Agent, or Firm* — Maschoff Brennan

(57) ABSTRACT

The present disclosure relates to a power module comprising: a base plate; a ceramic substrate bonded to the top surface of the base plate; a semiconductor chip bonded to the top surface of the ceramic substrate; a spacer bonded to the top surface of the ceramic substrate so as to be spaced apart from the semiconductor chip; a connection pin provided at an electrode layer formed on the top surface of the spacer; and a bonding wire for connecting a terminal of the semiconductor chip to the electrode layer of the spacer.

15 Claims, 3 Drawing Sheets

(51) Int. Cl.
*H10W 90/00* (2026.01)
*H10W 72/00* (2026.01)

(52) U.S. Cl.
CPC ........ *H10W 72/884* (2026.01); *H10W 90/734* (2026.01); *H10W 90/755* (2026.01)

(58) Field of Classification Search
CPC . H10W 90/755; H10W 72/072; H10W 72/30; H10W 70/611; H10W 90/401; H10W 76/15; H10W 70/692; H10W 70/658; H10W 72/07551; H05K 1/18
See application file for complete search history.

(56) References Cited

U.S. PATENT DOCUMENTS

| | | | | | |
|---|---|---|---|---|---|
| 2009/0127691 | A1 | 5/2009 | Lee | | |
| 2011/0285459 | A1* | 11/2011 | Uemura | H10W 90/00 | 257/140 |
| 2012/0211799 | A1 | 8/2012 | Chunlei | | |
| 2013/0062750 | A1 | 3/2013 | Linniger et al. | | |
| 2014/0110833 | A1* | 4/2014 | Yoo | H10W 76/136 | 257/697 |
| 2015/0008570 | A1* | 1/2015 | Arai | H10W 40/22 | 257/687 |
| 2020/0286800 | A1* | 9/2020 | Maruyama | H10W 70/093 | |
| 2023/0238315 | A1* | 7/2023 | Qiao | H10W 76/15 | 257/666 |

FOREIGN PATENT DOCUMENTS

| | | | |
|---|---|---|---|
| KR | 10-2001-0023983 | A | 3/2001 |
| KR | 10-2009-0050751 | A | 5/2009 |
| KR | 10-2013-0028866 | A | 3/2013 |
| KR | 10-2021-0070928 | A | 6/2021 |

* cited by examiner

[FIG. 1]
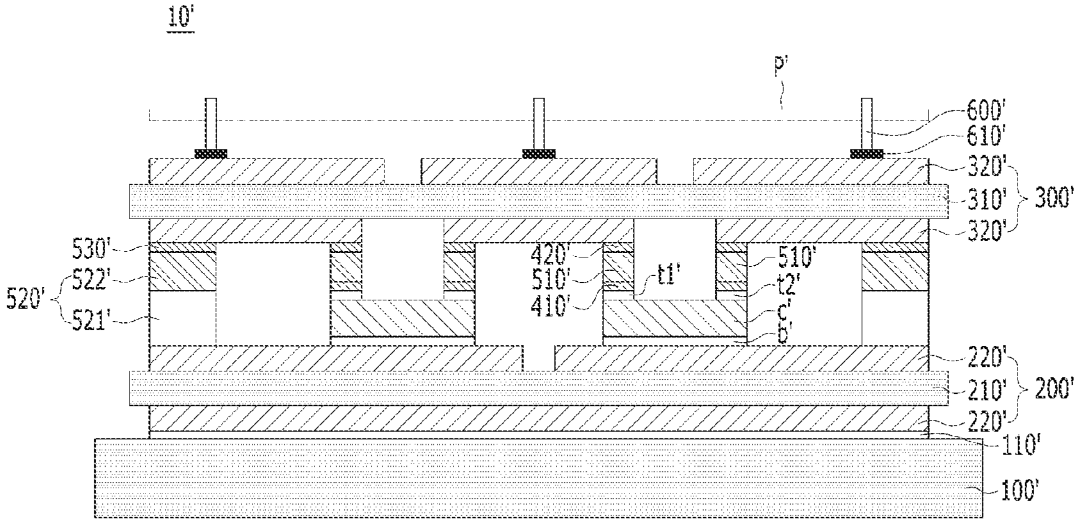
[FIG. 2]
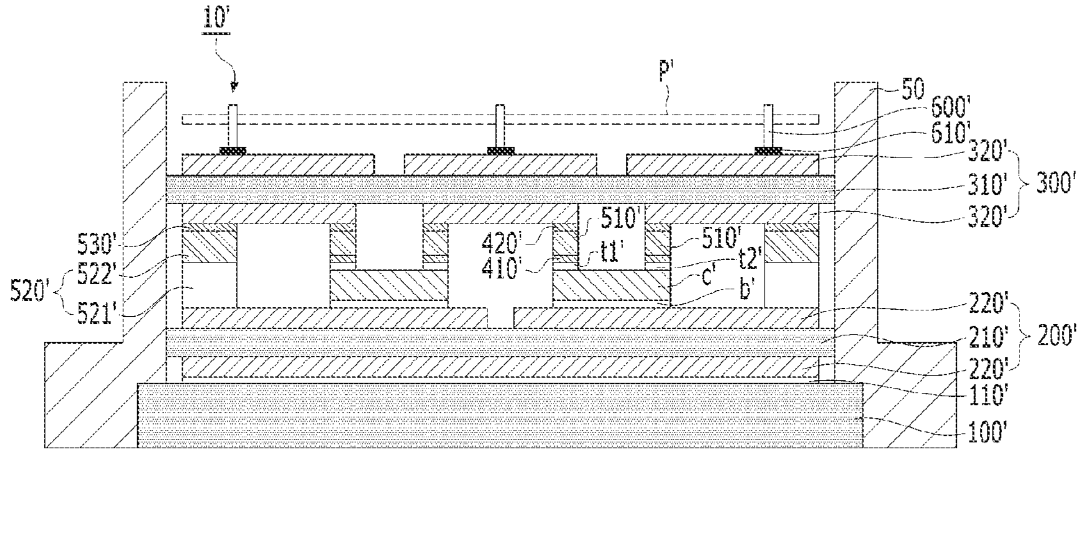

[FIG. 3]
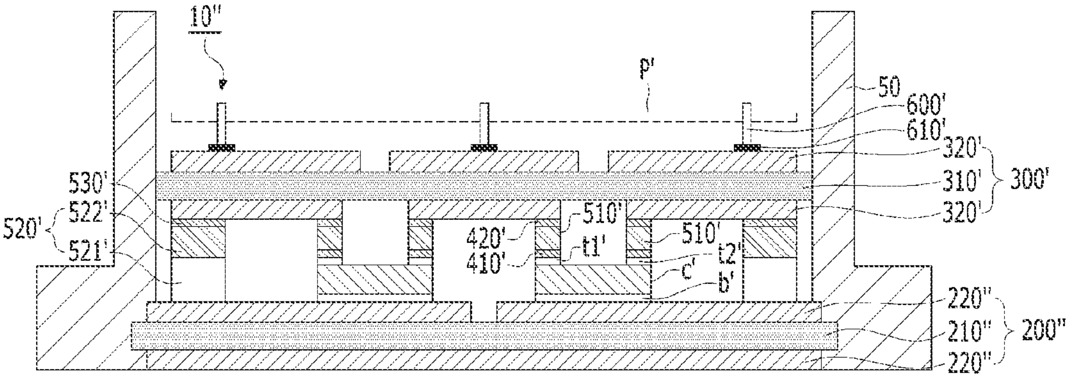
[FIG. 4]
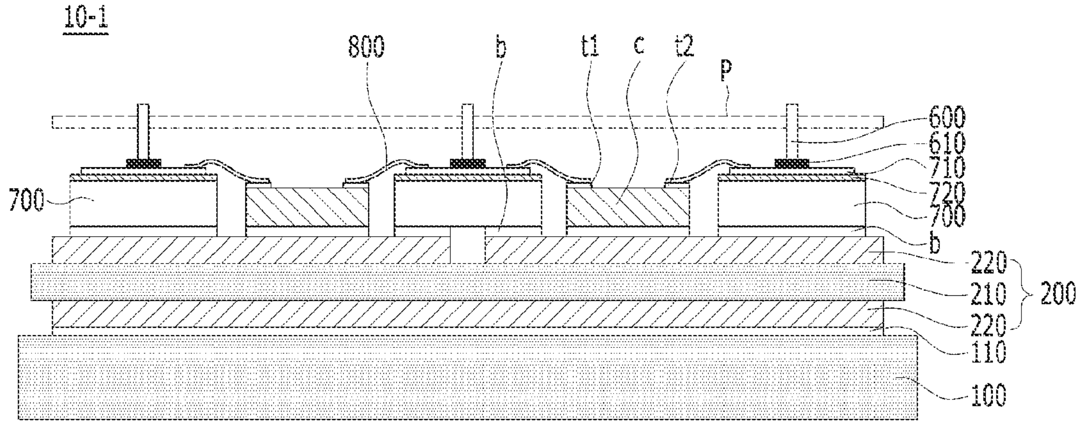

[FIG. 5]
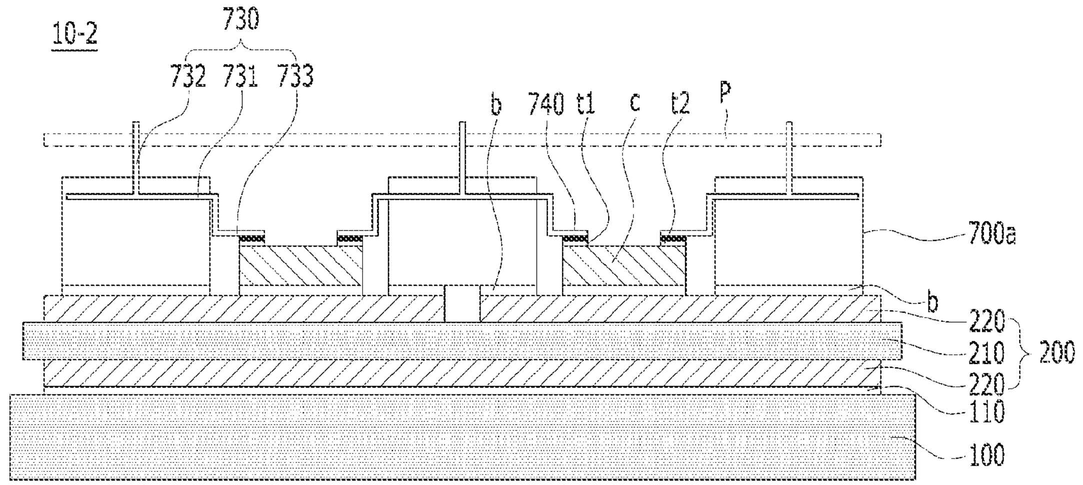
[FIG. 6]
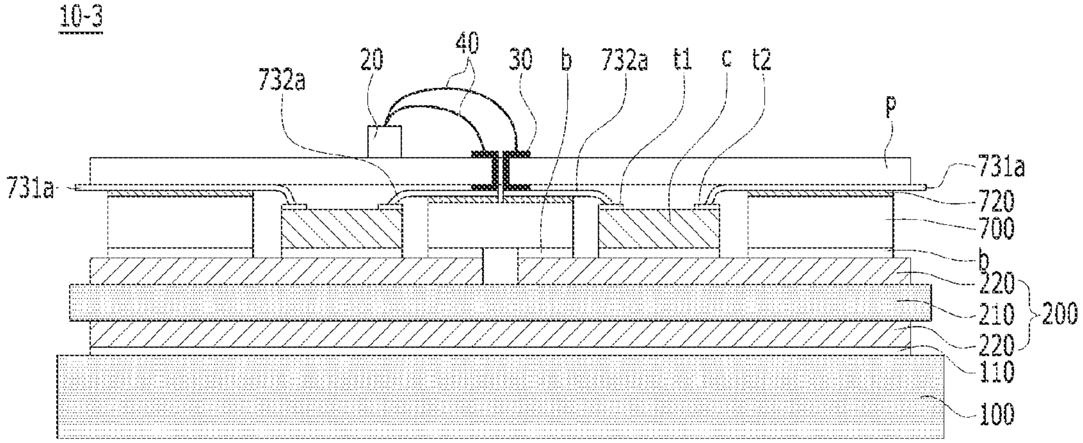

POWER MODULE

TECHNICAL FIELD

The present disclosure relates to a power module, and more specifically, to a power module in which a high-output power semiconductor chip is used.

BACKGROUND ART

Power modules are used to supply a high-voltage current to drive motors of hybrid electric vehicles, electric vehicles, and the like.

Among the power modules, a double-sided cooling power module includes a printed circuit board (PCB) substrate installed on an upper portion and a lower portion of a semiconductor chip and a base plate provided on outer surfaces of the PCB substrate. Since the double-sided cooling power module has excellent cooling performance compared to a single-sided cooling power module having a base plate on one surface thereof, its use is gradually increasing.

Since double-sided cooling power modules used in electric vehicles and the like have a power semiconductor chip, such as silicon carbide (SiC) and gallium nitride (GaN), mounted between two PCB substrates to generate high heat due to a high voltage and vibration during traveling, it is important to satisfy high strength and high heat radiation characteristics at the same time in order to solve this.

SUMMARY OF INVENTION

Technical Problem

The present disclosure is directed to providing a power module capable of simplifying processes through structure simplification, reducing the manufacturing cost by reducing used subsidiary materials (materials), improving reliability, and increasing a product yield.

Solution to Problem

A power module according to one embodiment of the present disclosure for achieving the object includes a base plate, a ceramic substrate bonded to an upper surface of the base plate, a semiconductor chip bonded to an upper surface of the ceramic substrate, a spacer bonded to the upper surface of the ceramic substrate to be spaced apart from the semiconductor chip, a connecting pin installed on an electrode layer formed on an upper surface of the spacer, and a bonding wire connecting terminals of the semiconductor chip to the electrode layer of the spacer.

The power module according to the present disclosure may further include a printed circuit board (PCB) substrate disposed above the ceramic substrate and connected to the connecting pin, wherein the semiconductor chip may be electrically connected to the PCB substrate through the bonding wire, the electrode layer, and the connecting pin.

The semiconductor chip may have a lower height than the spacer.

The power module according to the present disclosure may further include a bonding layer configured to fix the electrode layer to the upper surface of the spacer, wherein the bonding layer is formed of solder or Ag paste.

The semiconductor chip may be a gallium nitride (GaN) chip, and the ceramic substrate may be an active metal brazing (AMB) substrate.

A power module according to another embodiment of the present disclosure includes a housing in which an empty space is formed, a lower ceramic substrate having an edge fixed to the housing and a lower surface exposed to a lower portion of the housing, an upper ceramic substrate disposed to be spaced apart above the lower ceramic substrate, a semiconductor chip mounted on the upper surface of the lower ceramic substrate, and one or more spacers having one ends bonded to the lower ceramic substrate, having the other ends opposite thereto bonded to the upper ceramic substrate, and disposed at positions close to the semiconductor chip.

Here, the lower surfaces of the housing and the lower ceramic substrate may be formed to have the same plane.

In addition, the semiconductor chip may be a gallium nitride (GaN) chip, and the upper ceramic substrate and the lower ceramic substrate may be AMB substrates.

A power module according to still another embodiment of the present disclosure includes a base plate, a ceramic substrate bonded to an upper surface of the base plate, a semiconductor chip bonded to an upper surface of the ceramic substrate, a spacer bonded to the upper surface of the ceramic substrate to be spaced apart from the semiconductor chip, a printed circuit board (PCB) substrate disposed above the ceramic substrate and including a driving device, and a lead wire connecting a terminal of the semiconductor chip to the driving device.

Here, the semiconductor chip may have a lower height than the spacer.

In addition, the lead wire may include a horizontal lead wire fixed to an upper portion of the spacer, a vertical lead wire perpendicular to the horizontal lead wire, and a connecting lead wire protruding to one side or both sides of the horizontal lead wire and bonded to the terminal of the semiconductor chip.

In addition, the spacer may be in the form of insert molded block to include the horizontal lead wire, and the vertical lead wire and the connecting lead wire may be exposed outward from the spacer.

Meanwhile, the lead wire may include a first lead wire connected to the terminal of the semiconductor chip and extending outward while supported by the upper surface of the spacer, and a second lead wire connected to the terminal of the semiconductor chip and connected to the driving device while supported by the upper surface of the spacer.

Here, the second lead wire may come into contact with an electrode formed in a via hole of the PCB substrate, and the electrode may be connected to the driving device through a control line.

Advantageous Effects of Invention

According to the present disclosure, it is possible to simplify processes through structure simplification, reduce the manufacturing cost by reducing used subsidiary materials (materials), improve reliability by reducing thermal impact in the manufacturing process.

In addition, according to the present disclosure, it is possible to reduce the inductance value by minimizing the signal transmission path between the semiconductor chip and the PCB substrate, thereby increasing the driving efficiency of the package and increasing the product yield.

BRIEF DESCRIPTION OF DRAWINGS

FIG. 1 is a cross-sectional view illustrating a basic structure of a power module.

FIG. 2 is a cross-sectional view illustrating a form in which the power module of FIG. 1 is installed in a housing.

FIG. 3 is a cross-sectional view illustrating a modified example of the power module installed in the housing of FIG. 2.

FIG. 4 is a cross-sectional view illustrating a power module according to a first embodiment of the present disclosure.

FIG. 5 is a cross-sectional view illustrating a power module according to a second embodiment of the present disclosure.

FIG. 6 is a cross-sectional view illustrating a power module according to a third embodiment of the present disclosure.

DESCRIPTION OF EMBODIMENTS

Hereinafter, embodiments of the present disclosure will be described in detail with reference to the accompanying drawings. For reference, in cross-sectional views of FIGS. 1 to 6, relative thicknesses and lengths or relative sizes are exaggeratedly illustrated for convenience and clarity of description.

FIG. 1 is a cross-sectional view illustrating a power module having a basic structure.

As illustrated in FIG. 1, a basic structure of a power module 10' is that a lower ceramic substrate 200' may be bonded to an upper surface of a base plate 100', an upper ceramic substrate 300' may be disposed to be spaced apart above the lower ceramic substrate 200', and a printed circuit board (PCB) substrate P' may be disposed above the upper ceramic substrate 300'.

A semiconductor chip c' may be mounted on an upper surface of the lower ceramic substrate 200'. In addition, the semiconductor chip c' may be bonded to the upper ceramic substrate 300' via a first spacer 510'. The semiconductor chip c' may be a gallium nitride (GaN) chip. The GaN chip is a chip that functions as a high-power switch and a high-speed switch. Since the semiconductor chip c' is connected to the upper ceramic substrate 300' via the first spacer 510', the upper ceramic substrate 300' may be a main ceramic substrate through which a large current flows.

The lower ceramic substrate 200' may be bonded to a lower surface of the semiconductor chip c' via a bonding layer b'. Here, the bonding layer b' may be formed of one of solder, Ag paste, and Ag sintering paste. In addition, the bonding layer b' may be a brazing bonding layer containing one selected from Ti, Ag, Cu, and AgCu, or an alloy mixed with two or more among them. As described above, the semiconductor chip c' may be stably fixed between the two ceramic substrates 200' and 300', and the heat generated from the semiconductor chip c' may be quickly transferred to the base plate 100'.

The lower ceramic substrate 200' and the upper ceramic substrate 300' become active metal brazing (AMB) substrates to increase the heat radiation efficiency of the heat generated from the semiconductor chip c'. The AMB substrate is a ceramic substrate that includes ceramic bases 210' and 310' and metal layers 220' and 320' brazed to upper and lower surfaces of the ceramic bases 210' and 310'.

The base plate 100' may function as a heat radiation plate bonded to the lower surface of the lower ceramic substrate 200' via a bonding layer 110' to quickly discharge the heat generated from the semiconductor chip c' to the outside. The base plate 100' may be made of Cu.

A conductive spacer 510' may be disposed between the semiconductor chip c' and the metal layer 320' of the upper ceramic substrate 300' and may connect terminals t1' and t2' of the semiconductor chip c' to the metal layer 320' of the upper ceramic substrate 300'. Here, each of the terminals t1' and t2' of the semiconductor chip c' may be any one of a drain terminal, a source terminal, and a gate terminal.

The conductive spacer 510' may be connected to the terminals t1' and t2' of the semiconductor chip c' by a first bonding layer 410'. In addition, the conductive spacer 510' may be connected to the metal layer 320' of the upper ceramic substrate 300' by a second bonding layer 420'. The first bonding layer 410' and the second bonding layer 420' may be formed of solder. Alternatively, the first bonding layer 410' and the second bonding layer 420' may be formed of Ag paste or Ag sintering paste to increase a bonding strength and secure electrical properties. The conductive spacer 510' may be made of Cu or Cu+CuMo alloy.

An insulating spacer 520' may be disposed between the lower ceramic substrate 200' and the upper ceramic substrate 300' to increase electrical insulation and heat radiation efficiency. The insulating spacer 520' may become a structure including an insulating layer 521' for insulating the lower ceramic substrate 200' and the upper ceramic substrate 300', and a metal stud layer 522' made of a metal material for strength reinforcement. The insulating spacer 520' may have one end brazed to the lower ceramic substrate 200' and the other end opposite thereto bonded to the upper ceramic substrate 300' by an attachment layer 530'. The attachment layer 530' may be formed of any one of solder, Ag paste, and g sintering paste.

A connecting pin 600' may be installed on the upper ceramic substrate 300'. The connecting pin 600' may be installed by a method of being fitted into a through hole (not illustrated) formed in the upper ceramic substrate 300' and fixed to the through hole via a solder layer 610'. The connecting pin 600' may come into contact with the metal layer 320' positioned on the upper and lower surfaces of the upper ceramic substrate 300', and thus may be connected to the semiconductor chip c'. The connecting pin 600' may be made of Cu. The metal layer 320' positioned on the upper and lower surfaces of the upper ceramic substrate 300' may be formed with electrode patterns to become a path through which a high current flows. The power module 10' may be connected to a separate substrate through the connecting pin 600'. For example, the connecting pin 600' may be connected to the PCB substrate P'. For reference, FIGS. 1 to 3 schematically illustrate the PCB substrate P' connected to the connecting pin 600', and the PCB substrate P' may be connected to the connecting pin 600' in various ways. In addition, although not illustrated, the connecting pin 600' may be connected to a wire (not illustrated) or a cable (not illustrated).

Meanwhile, although not illustrated, a plurality of via holes (not illustrated) may be formed in the upper ceramic substrate 300'. Here, since the via hole is filled with a conductive material therein to enable conduction between the metal layer 320' positioned on the upper surface of the upper ceramic substrate 300' and the metal layer 320' positioned on the lower surface thereof, it is possible to prevent the occurrence of a problem, such as a short circuit or overheating, caused by a high current flowing to only one side.

In the basic structure of the power module 10' illustrated in FIG. 1, a path through which an operation signal of the semiconductor chip c' is transmitted to the PCB substrate P' or a driving signal of the PCB substrate P' for switching the semiconductor chip c' is transmitted to the semiconductor chip c' becomes the semiconductor chip c'—the first bonding layer 410'—the conductive spacer 510'—the second bonding layer 420'—the metal layer 320' positioned on the lower surface of the upper ceramic substrate 300'—the through hole (not illustrated)—the metal layer 320' positioned on the upper surface of the upper ceramic substrate 300'—the solder layer 610'—the connecting pin 600'—the PCB substrate P'.

In other words, the basic structure of the power module 10' illustrated in FIG. 1 is a five-layer structure of the base plate 100', the lower ceramic substrate 200', the semiconductor chip c'/the insulating layer 521', the conductive spacer 510'/the stud layer 522', and the upper ceramic substrate 300'.

FIG. 2 is a cross-sectional view illustrating a form in which the power module of FIG. 1 is installed in a housing, and FIG. 3 is a cross-sectional view illustrating a modified example of the power module installed in the housing of FIG. 2.

As illustrated in FIG. 2, the power module 10' may be installed in a housing 50 in which an empty space is formed. In FIGS. 2 and 3, the housing 50 is illustrated as being open vertically, but an upper opening of the housing 50 may be finally covered by a cover (not illustrated).

The housing 50 may accommodate and package various components constituting the power module 10'. The housing 50 may have a shape of protecting the base plate 100', the lower ceramic substrate 200', the upper ceramic substrate 300', the PCB substrate P', and the semiconductor chip c', which are disposed therein. In the power module 10' disposed inside the housing 50, the upper ceramic substrate 300' may be disposed to be spaced apart above the lower ceramic substrate 200', and the semiconductor chip c' may be mounted on the upper surface of the lower ceramic substrate 200'.

The insulating spacer 520' may have one end bonded to the lower ceramic substrate 200' and the other end opposite thereto bonded to the upper ceramic substrate 300', and one or more insulating spacers 520' may be disposed at a position close to the semiconductor chip c', and preferably, a plurality of insulating spacers 520' may be disposed. The insulating spacer 520' may function to prevent the bending of the lower ceramic substrate 200' and the upper ceramic substrate 300' and protect the semiconductor chip c' disposed therebetween by supporting the lower ceramic substrate 200' and the upper ceramic substrate 300'.

As illustrated in FIG. 2, when the base plate 100' of the power module 10' is fixed to an edge of the housing 50, a lower surface of the base plate 100' is exposed to a lower portion of the housing 50. When thermal contraction and expansion occur in this state, a component may be broken due to deformation of the base plate 100'. In order to prevent this, a power module 10" according to the modified example of FIG. 3 may have a structure in which the base plate 100' of FIG. 2 is removed. In the power module 10" according to the modified example of FIG. 3, an edge of a lower ceramic substrate 200" may be fixed to the housing 50, and a lower surface of the lower ceramic substrate 200" may be exposed to the lower portion of the housing 50 to function to perform a heat radiation function instead of the base plate 100' of FIG. 2. Here, the lower surfaces of the housing 50 and the lower ceramic substrate 200" may be formed to have the same plane.

Compared to the power module 10' illustrated in FIG. 2, the power module 10" according to the modified example of FIG. 3 may have a configuration in which the base plate 100' is removed, and thus it is possible to simplify the structure to reduce the number of processes and materials, thereby reducing the manufacturing cost. In addition, it is possible to minimize the cracking of components due to the deformation of the base plate 100' during thermal contraction and expansion, thereby improving reliability.

Hereinafter, embodiments that minimize the signal transmission path between the semiconductor chip c and the PCB substrate P by changing the above-described basic structure of the power module will be described.

FIG. 4 is a cross-sectional view illustrating a power module according to a first embodiment of the present disclosure.

As illustrated in FIG. 4, a power module 10-1 according to a first embodiment of the present invention may include a base plate 100, a ceramic substrate 200, a semiconductor chip c, a connecting pin 600, a spacer 700, and a bonding wire 800.

Compared to the basic structure of the power module 10' illustrated in FIG. 1, the power module 10-1 according to the first embodiment of the present invention may have a structure in which the upper ceramic substrate 300' is removed and the semiconductor chip c is connected to the PCB substrate P. In other words, the power module 10-1 according to the first embodiment can minimize the signal transmission path and reduce the unit cost by converting a structure in which a large current passes through the semiconductor chip c into a component.

The power module 10-1 according to the first embodiment of the present invention may have a structure in which the upper ceramic substrate 300', which is a portion of the basic structure of the power module 10' composed of the base plate 100', the lower ceramic substrate 200', the upper ceramic substrate 300', and the PCB substrate P', is removed and can reduce thermal impact in the manufacturing process of the power module.

Since the ceramic substrates 200' and 300' of a vertical double-layer structure are used in the basic structure of the power module 10' illustrated in FIG. 1, there may occur a problem that thermal deform occurs due to different coefficients of thermal expansion between the ceramic substrates 200' and 300' and components in the process of coupling the lower ceramic substrate 200' and the upper ceramic substrate 300', and components in contact with the lower ceramic substrate 200' and the upper ceramic substrate 300' are broken. Therefore, in the power module 10-1 according to the first embodiment of the present invention, the upper ceramic substrate 300' may be removed and a portion necessary for installing the semiconductor chip c is converted into a component, thereby reducing a defect rate according to the coefficient of thermal expansion.

Referring to FIG. 4, in the power module 10-1 according to the first embodiment, the ceramic substrate 200 may be bonded to an upper surface of the base plate 100, the semiconductor chip c may be bonded to an upper surface of the ceramic substrate 200, and the spacer 700 may be bonded on the upper surface of the ceramic substrate 200 to be spaced apart from the semiconductor chip c. In the power module 10-1, an electrode layer 710 may be formed on an upper surface of the spacer 700, the connecting pin 600 may be installed on the electrode layer 710, and the terminals t1 and t2 of the semiconductor chip c and the electrode layer 710 of the spacer 700 may be connected by the bonding wire 800. For reference, FIG. 4 schematically illustrates the PCB substrate P connected to the connecting pin 600, and the PCB substrate P may be connected to the connecting pin 600 in various ways.

The base plate 100 may be made of Cu and may function as a heat radiation plate. The base plate 100 may be formed in a shape of a quadrangular plate having a predetermined thickness.

The ceramic substrate 200 may be an AMB substrate. The AMB substrate is a ceramic substrate that includes a ceramic base 210 and a metal layer 220 brazed to upper and lower surfaces of the ceramic base 210.

The ceramic substrate 200 may transfer heat generated from the semiconductor chip c to the base plate 100 and prevent a short circuit by insulating between the semiconductor chip c and the base plate 100. The ceramic substrate 200 may be soldered to the upper surface of the base plate 100 via the bonding layer 110.

The semiconductor chip c may be a GaN chip. The spacer 700 may be an insulating spacer. One or more spacers 700 may be disposed at a position close to the semiconductor chip c, and preferably, a plurality of spacers may be disposed. In addition, the semiconductor chip c may be provided to have a lower height than the spacer 700.

The connecting pin 600 may be soldered to the electrode layer 710 of the spacer 700 via the solder layer 610. The connecting pin 600 may connect the semiconductor chip c mounted on the ceramic substrate 200 to a driving device (not illustrated) mounted on the PCB substrate P at the shortest distance. As described above, a structure in which the semiconductor chip c and the PCB substrate P are connected at the shortest distance can contribute to resolving limitations according to the size of the power module by removing various output losses.

Although not illustrated in detail, the connecting pin 600 may be manufactured as a bundle of connecting pins connected to each other, and this bundle of connecting pins may be installed on the electrode layer 710 of the spacer 700.

The bonding wire 800 electrically connects the terminals t1 and t2 of the semiconductor chip c to the electrode layer 710 on which the connecting pin 600 is installed. Each of the terminals t1 and t2 of the semiconductor chip c may be any one of a drain terminal, a source terminal, and a gate terminal. Here, the gate terminal may be connected to the connecting pin 600 to function as a terminal for turning on and off the semiconductor chip c. In addition, the drain terminal and the source terminal may be responsible for inputting and outputting a current by connecting the semiconductor chip c to the power terminal through the bonding wire 800. A shape and a length of the bonding wire 800 are not limited to those illustrated in FIG. 4, and if necessary, various shapes of the bonding wires may be applied.

The electrode layer 710 may be formed of a Cu layer. The electrode layer 710 may be fixed to the upper surface of the spacer 700 by a bonding layer 720. The bonding layer 720 may be formed of solder or Ag paste. The bonding layer 720 may be formed of Ag sintering paste in order to firmly fix the electrode layer 710 to the upper surface of the spacer 700.

The electrode layer 710 bonded to the upper surface of the spacer 700 may be used to connect the PCB substrate P connected to the connecting pin 600 to the semiconductor chip c. In other words, the semiconductor chip c may be electrically connected to the PCB substrate P disposed above the ceramic substrate 200 through the bonding wire 800, the electrode layer 710, and the connecting pin 600.

The semiconductor chip c and the spacer 700 may be bonded to the ceramic substrate 200 via a bonding layer b. The bonding layer b may be formed of one of solder, Ag paste, and Ag sintering paste. In addition, the bonding layer b may be a brazing bonding layer containing one selected from Ti, Ag, Cu, and AgCu, or an alloy mixed with two or more among them.

In the power module 10-1 according to the first embodiment, a path through which an operation signal of the semiconductor chip c is transmitted to the PCB substrate P or a driving signal of the PCB substrate P for switching the semiconductor chip c is transmitted to the semiconductor chip c may become the semiconductor chip c—the bonding wire 800—the electrode layer 710—the solder layer 610—the connecting pin 600—the PCB substrate P.

In other words, the power module 10-1 according to the first embodiment may have a three-layer structure of the base plate 100, the ceramic substrate 200, and the semiconductor chip c/the spacer 700, and the semiconductor chip c may be electrically connected to the PCB substrate P disposed above the ceramic substrate 200 through the bonding wire 800, the electrode layer 710, and the connecting pin 600.

As described above, since the power module 10-1 according to the first embodiment can reduce the inductance value by minimizing the signal transmission path, it is possible to increase the driving efficiency of the package and reduce the unit cost by reducing the number of components. In addition, by reducing a thermal impact during the process, it is possible to minimize the cracking of components due to the deformation of the ceramic substrate during thermal contraction and expansion, thereby improving defects in the manufacturing process and improving product reliability.

FIG. 5 is a cross-sectional view illustrating a power module according to a second embodiment of the present disclosure.

As illustrated in FIG. 5, a power module 10-2 according to a second embodiment of the present disclosure may include the base plate 100 that may be made of Cu and may function as a heat radiation plate, the ceramic substrate 200 bonded to the upper surface of the base plate 100, the semiconductor chip c bonded to the upper surface of the ceramic substrate 200, a spacer **700*a* bonded to the upper surface of the ceramic substrate 200 to be spaced apart from the semiconductor chip c, the PCB substrate P disposed above the ceramic substrate 200 and including a driving device (reference numeral 20 in FIG. 6), and a lead wire 730 connecting the terminals t1 and t2 of the semiconductor chip c to the driving device 20. Here, the ceramic substrate 200 may be an AMB substrate, and the semiconductor chip c may be a GaN chip. The spacer 700*a* may be an insulating spacer. Here, one or more spacers 700*a* may be disposed at a position close to the semiconductor chip c, and preferably, a plurality of spacers may be disposed. The semiconductor chip c may be provided to have a lower height than the spacer 700*a*. The spacer 700*a* may be bonded to the ceramic substrate 200** via the bonding layer b. The bonding layer b may be formed of one of solder, Ag paste, and Ag sintering paste. In addition, the bonding layer b may be a brazing bonding layer containing one selected from Ti, Ag, Cu, and AgCu, or an alloy mixed with two or more among them.

The power module 10-2 according to the second embodiment of the present disclosure includes the lead wire 730 molded integrally with the spacer **700*a* through insert molding compared to the power module 10-1 according to the first embodiment illustrated in FIG. 4**.

The lead wire 730 may include a horizontal lead wire 731 fixed to an upper portion of the spacer **700*a*, a vertical lead wire 732 perpendicular to the horizontal lead wire 731, and a connecting lead wire 733 protruding to one side or both sides of the horizontal lead wire 731 and bonded to the terminals t1 and t2 of the semiconductor chip c via the solder bonding layer 740**.

The lead wire 730 may be in the form of a frame and made of a solid copper material. The frame-shaped lead wire 730 can stably maintain electrical connection by expanding a contact area when connected to the terminals t1 and t2 of the semiconductor chip c and increase operational reliability.

The spacer 700*a* may be in the form of an insert molded block to include the horizontal lead wire 731. Here, the vertical lead wire 732 and the connecting lead wire 733 connected to the horizontal lead wire 731 may extend outward from the spacer 700*a* and may be exposed outward from the spacer 700*a*. In addition, the vertical lead wire 732 may be connected to the PCB substrate P. For reference, FIG. 5 schematically illustrates the PCB substrate P connected to the vertical lead wire 732, and the PCB substrate P may be connected to the vertical lead wire 732 in various ways.

Since the power module 10-2 according to the second embodiment is in the form of insert molded block to include the lead wire 730 in the spacer 700*a*, there is no need to fix the lead wire 730 to the spacer through a soldering process, and thus it is possible to reduce the number of processes and materials, reduce the manufacturing cost, and improve productivity.

In addition, the power module 10-2 according to the second embodiment can minimize the signal transmission path and reduce the unit cost by converting a structure in which the semiconductor chip c is connected to the PCB substrate P and a structure in which a large current passes through the semiconductor chip c into components.

In addition, since the power module 10-2 according to the second embodiment has a structure in which the upper ceramic substrate 300' is removed from the multi-layer structure of the basic structure of the power module 10' illustrated in FIG. 1, it is possible to reduce the thermal impact in the manufacturing process of the power module like the power module 10-1 according to the first embodiment.

In the power module 10-2 according to the second embodiment, a path through which an operation signal of the semiconductor chip c is transmitted to the PCB substrate P or a driving signal of the PCB substrate P for switching the semiconductor chip c is transmitted to the semiconductor chip c may become the semiconductor chip c—the solder bonding layer 740—the lead wire 730—the PCB substrate P.

As described above, the power module 10-2 according to the second embodiment can reduce the inductance value by minimizing the electrical path and increase the driving efficiency of the package. In addition, the power module 10-2 according to the second embodiment can mitigate impacts between the ceramic substrate and components when movement occurs due to the coefficients of thermal expansion of the components mounted on the ceramic substrate.

FIG. 6 is a cross-sectional view illustrating a power module according to a third embodiment of the present disclosure.

As illustrated in FIG. 6, a power module 10-3 according to a third embodiment of the present disclosure may include the base plate 100, the ceramic substrate 200, the semiconductor chip c, the spacer 700, and lead wires 731*a* and 732*a*.

Compared to the basic structure of the power module 10' illustrated in FIG. 1, the power module 10-3 according to the third embodiment of the present disclosure may have a structure in which the upper ceramic substrate 300' is removed and the structure in which the semiconductor chip c and the PCB substrate P are connected is changed, and there is an advantage in that it is possible to improve process defects and increase a yield.

The basic structure of the power module 10' illustrated in FIG. 1 has a three-layer structure consisting of the base plate 100', the lower ceramic substrate 200', and the upper ceramic substrate 300', and there is a high probability that process defects will occur due to a different coefficient of thermal expansion from the PCB substrate P' (CTE mismatch). In addition, the basic structure of the power module 10' may have a yield problem due to process defects that occur when the terminals t1' and t2' of the semiconductor chip c and the upper ceramic substrate 300' are connected. For example, when a process of filling an electrode material into a via hole (not illustrated) formed in the upper ceramic substrate 300' is performed, filling defects may occur. In addition, in the process of fixing the connecting pin 600' to the through hole (not illustrated) formed in the upper ceramic substrate 300' and connecting the PCB substrate P' through the connecting pin 600', the manufacturing cost may be increased due to a complicated manufacturing process. Therefore, in the power module 10-3 according to the third embodiment, the upper ceramic substrate 300' may be removed and a portion necessary for installing the semiconductor chip c is formed simply, thereby reducing a defect rate due to a difference between the coefficients of thermal expansion.

Specifically, the power module 10-3 according to the third embodiment of the present disclosure may include the base plate 100 that may be made of Cu and may function as a heat radiation plate, the ceramic substrate 200 bonded to the upper surface of the base plate 100, the semiconductor chip c bonded to the upper surface of the ceramic substrate 200, the spacer 700 bonded to the upper surface of the ceramic substrate 200 to be spaced apart from the semiconductor chip c, the PCB substrate P which is disposed above the ceramic substrate 200 and a driving circuit substrate having the driving device 20, and the lead wires 731*a* and 732*a* connecting the terminals t1 and t2 of the semiconductor chip c to the driving device 20.

Here, the PCB substrate P may be an FR4 substrate having internal electrodes connected to the lead wires 731*a* and 732*a*. The ceramic substrate 200 may be an AMB substrate. The ceramic substrate 200 may transfer heat generated from the semiconductor chip c to the base plate 100 and prevent a short circuit by insulating between the semiconductor chip c and the base plate 100. The ceramic substrate 200 may be soldered to the upper surface of the base plate 100 via the bonding layer 110. The semiconductor chip c may be a GaN chip. The spacer 700 may be an insulating spacer. The spacer 700 may be brazed to be firmly fixed to the upper surface of the ceramic substrate 200. One or more spacers 700 may be disposed at a position close to the semiconductor chip c, and preferably, a plurality of spacers may be disposed. In addition, the semiconductor chip c may be provided to have a lower height than the spacer 700. The spacer 700 may be bonded to the ceramic substrate 200 via the bonding layer b. The bonding layer b may be formed of one of solder, Ag paste, and Ag sintering paste. In addition, the bonding layer b may be a brazing bonding layer containing one selected from Ti, Ag, Cu, and AgCu, or an alloy mixed with two or more among them.

The lead wires 731*a* and 732*a* may be made of Cu. Here, the first lead wire 731*a* may be connected to the terminals t1 and t2 of the semiconductor chip c, and specifically, the first lead wire 731*a* may have one end connected to the source terminal or drain terminal of the semiconductor chip c. The first lead wire 731*a* may extend outward while supported by the upper surface of the spacer 700 and connected to the power terminal. Here, a lower surface of the first lead wire 731*a* may be bonded to the upper surface of the spacer 700 via the bonding layer 720, and an upper surface of the first lead wire 731*a* may come into contact with the PCB substrate P.

The second lead wire 732*a* may be connected to the terminals t1 and t2 of the semiconductor chip c, and specifically, the second lead wire 732*a* may have one end connected to the gate terminal of the semiconductor chip c. The second lead wire 732*a* may be connected to the driving device 20 of the PCB substrate P while supported by the upper surface of the spacer 700. Here, a lower surface of the second lead wire 732*a* may be bonded to the upper surface of the spacer 700 via the bonding layer 720, and an upper surface of the second lead wire 732*a* may come into contact with an electrode 30 formed in the via hole of the PCB substrate P. In this case, the electrode 30 formed in the via hole of the PCB substrate P may be connected to the driving device 20 through a control line 40. Therefore, the second lead wire 732*a* may be electrically connected to the driving device 20 of the PCB substrate P through the electrode 30 and the control line 40.

As described above, the power module 10-3 according to the third embodiment may adopt electrical connection using the lead wires 731*a* and 732*a* instead of the electrical connection through the upper ceramic substrate in which via holes and through holes are formed. Therefore, it is possible to improve defects caused by via filling into the upper ceramic substrate and solve a defect problem that occurs when the semiconductor chip is connected to the upper ceramic substrate, thereby solving the yield problem. In addition, since the power module 10-3 according to the third embodiment may have the structure in which the expensive upper ceramic substrate in which via holes and through holes are formed is removed, thereby greatly reducing the cost.

The best embodiments of the present disclosure have been disclosed in the drawings and the specification. Here, although specific terms are used, they are used only for the purpose of describing the present disclosure and are not used to limit the meaning or scope of the present disclosure described in the claims. Therefore, those skilled in the art will understand that various modifications and equivalent embodiments are possible from the present disclosure. Therefore, the true technical scope of the present disclosure should be determined by the technical spirit of the appended claims.

The invention claimed is:

1. A power module comprising:
- a base plate;
- a ceramic substrate bonded to an upper surface of the base plate;
- a semiconductor chip bonded to an upper surface of the ceramic substrate;
- an insulating spacer bonded to the upper surface of the ceramic substrate to be spaced apart from the semiconductor chip;
- an electrode layer formed on an upper surface of the insulating spacer;
- a bonding layer configured to fix the electrode layer to the upper surface of the insulating spacer, wherein the bonding layer is formed of solder or Ag paste;
- a connecting pin installed on the electrode layer; and
- a bonding wire connecting terminals of the semiconductor chip to the electrode layer of the insulating spacer.

2. The power module of claim 1, further comprising a printed circuit board (PCB) substrate disposed above the ceramic substrate and connected to the connecting pin,
- wherein the semiconductor chip is electrically connected to the PCB substrate through the bonding wire, the electrode layer, and the connecting pin.

3. The power module of claim 1, wherein the semiconductor chip has a lower height than the insulating spacer.

4. The power module of claim 1, wherein the semiconductor chip is a gallium nitride (GaN) chip.

5. The power module of claim 1, wherein the ceramic substrate is an active metal brazing (AMB) substrate.

6. A power module comprising:
- a housing in which an empty space is formed;
- a lower ceramic substrate having an edge fixed to the housing and a lower surface exposed to a lower portion of the housing;
- an upper ceramic substrate disposed to be spaced apart above the lower ceramic substrate;
- a semiconductor chip mounted on the upper surface of the lower ceramic substrate; and
- one or more spacers having one ends bonded to the lower ceramic substrate, having the other ends opposite thereto bonded to the upper ceramic substrate, and disposed at positions close to the semiconductor chip.

7. The power module of claim 6, wherein lower surfaces of the housing and the lower ceramic substrate are formed to have the same plane.

8. The power module of claim 6, wherein the semiconductor chip is a GaN chip.

9. The power module of claim 6, wherein the upper ceramic substrate and the lower ceramic substrate are AMB substrates.

10. A power module comprising:
- a base plate;
- a ceramic substrate bonded to an upper surface of the base plate;
- a semiconductor chip bonded to an upper surface of the ceramic substrate;
- a spacer bonded to the upper surface of the ceramic substrate to be spaced apart from the semiconductor chip;
- a printed circuit board (PCB) substrate disposed above the ceramic substrate and including a driving device; and
- a lead wire connecting a terminal of the semiconductor chip to the driving device.

11. The power module of claim 10, wherein the semiconductor chip has a lower height than the spacer.

12. The power module of claim 10, wherein the lead wire includes:
- a horizontal lead wire fixed to an upper portion of the spacer;
- a vertical lead wire perpendicular to the horizontal lead wire; and
- a connecting lead wire protruding to one side or both sides of the horizontal lead wire and bonded to the terminal of the semiconductor chip.

13. The power module of claim 12, wherein the spacer is in the form of insert molded block to include the horizontal lead wire, and
- the vertical lead wire and the connecting lead wire are exposed outward from the spacer.

14. The power module of claim 10, wherein the lead wire includes:
- a first lead wire connected to the terminal of the semiconductor chip and extending outward while supported by the upper surface of the spacer; and a second lead wire connected to the terminal of the semiconductor chip and connected to the driving device while supported by the upper surface of the spacer.

15. The power module of claim 14, wherein the second lead wire comes into contact with an electrode formed in a via hole of the PCB substrate, and the electrode is connected to the driving device through a control line.

* * * * *